(12) United States Patent
Chen et al.

(10) Patent No.: US 12,726,156 B2
(45) Date of Patent: Sep. 1, 2026

(54) RF POWER AMPLIFIERS AND ELECTRONIC DEVICE

(71) Applicant: SMARTER MICROELECTRONICS (SHANGHAI) CO., LTD., Shanghai (CN)

(72) Inventors: Chen Chen, Shanghai (CN); Yiwei Hou, Shanghai (CN); Zhenfei Peng, Shanghai (CN)

(73) Assignee: SMARTER MICROELECTRONICS (SHANGHAI) CO., LTD., Shanghai (CN)

( * ) Notice: Subject to any disclaimer, the term of this patent is extended or adjusted under 35 U.S.C. 154(b) by 166 days.

(21) Appl. No.: 19/017,561

(22) Filed: Jan. 11, 2025

(65) Prior Publication Data

US 2025/0219588 A1 Jul. 3, 2025

(30) Foreign Application Priority Data

Dec. 27, 2023 (CN) ........................ 202311834892.0

(51) Int. Cl.
*H03F 1/02* (2006.01)
*H03F 1/56* (2006.01)
*H03F 3/24* (2006.01)

(52) U.S. Cl.
CPC ........... *H03F 1/0288* (2013.01); *H03F 1/565* (2013.01); *H03F 3/245* (2013.01); *H03F 2200/387* (2013.01); *H03F 2200/451* (2013.01)

(58) Field of Classification Search
CPC . H03F 3/45475; H03G 3/30; H03G 2201/103
(Continued)

(56) References Cited

U.S. PATENT DOCUMENTS

2019/0379340 A1* 12/2019 Rattan ............... H04L 25/03885
2021/0013572 A1* 1/2021 Zhu .......................... H03F 3/24

FOREIGN PATENT DOCUMENTS

EP 3133735 B1 * 6/2020 ........... H01L 21/561

OTHER PUBLICATIONS

Tran Ngoc Tu, “Report on T-section and pi-section matching network” published in studocu site as a common knowledge (Year: 2020).*

(Continued)

*Primary Examiner* — Hafizur Rahman
(74) *Attorney, Agent, or Firm* — Syncoda LLC; Feng Ma

(57) ABSTRACT

A radio frequency power amplifier includes a main amplifier, a main matching circuit, an auxiliary amplifier, an auxiliary matching circuit and an impedance conversion circuit. The main amplifier is configured to output a first amplified signal. The main matching circuit is connected between the main amplifier and a combining node, including at least one-stage impedance matching circuit and is configured to adjust a phase of the first amplified signal and raise an output impedance of the main amplifier to a first impedance. The auxiliary amplifier is configured to output a second amplified signal. The auxiliary matching circuit is connected between the auxiliary amplifier and the combining node, including a multi-stage impedance matching circuit and is configured to adjust a phase of the second amplified signal and raise an output impedance of the auxiliary amplifier to a second impedance. The impedance conversion circuit is connected to the combining node.

15 Claims, 5 Drawing Sheets

(58) Field of Classification Search
USPC .......................................................... 330/254
See application file for complete search history.

(56) References Cited

OTHER PUBLICATIONS

Revisiting the Doherty PA ARMMS, UK, Nov. 24/25, 2008, Steve C Cripps, Ph.D, Hywave Associates (Year: 2008).*

* cited by examiner

RF POWER AMPLIFIERS AND ELECTRONIC DEVICE

CROSS-REFERENCE TO RELATED APPLICATION

The present application claims priority to Chinese Patent Application No. 202311834892.0 filed on Dec. 27, 2023, the disclosure of which is hereby incorporated by reference in its entirety.

BACKGROUND

In mobile communication systems, such as 5th Generation Mobile Communication Technology (5G) New Radio (NR) mobile communication systems, more complex modulation schemes are adopted to improve spectrum utilization efficiency, increase data capacity and transmission rate, but their Peak to Average Power Ratio (PAPR) continues to increase, which requires a transmitting system to maintain high linearity in a large dynamic range. In order to meet linearity requirements of the system, a radio frequency Power Amplifier (PA) needs to operate in a power back-off state, but Power Added Efficiency (PAE) decreases significantly with the power back-off.

How to improve the power added efficiency of the RF power amplifier after the power back-off is an urgent problem in the field of RF power amplifiers.

SUMMARY

In view of the foregoing, embodiments of the present application provide a radio frequency power amplifier and an electronic device, for solving at least one technical problem existing in some implementations.

The present application relates to the field of electronic technologies, in particular to a radio frequency (RF) power amplifier and an electronic device.

According to a first aspect, an embodiment of the present application provides a radio frequency power amplifier. The radio frequency power amplifier includes a main amplifier, a main matching circuit, an auxiliary amplifier, an auxiliary matching circuit and an impedance conversion circuit.

The main amplifier is configured to output a first amplified signal.

The main matching circuit is connected between the main amplifier and a combining node, includes at least one-stage impedance matching circuit and is configured to adjust a phase of the first amplified signal and raise an output impedance of the main amplifier to a first impedance.

The auxiliary amplifier is configured to output a second amplified signal.

The auxiliary matching circuit is connected between the auxiliary amplifier and the combining node, includes a multi-stage impedance matching circuit and is configured to adjust a phase of the second amplified signal and raise an output impedance of the auxiliary amplifier to a second impedance. Herein, an impedance at the combining node is a combined impedance of the first impedance and the second impedance, which is greater than the output impedance of the main amplifier and the output impedance of the auxiliary amplifier.

The impedance conversion circuit is connected to the combining node and is configured to raise the impedance at the combining node to a transmission impedance.

In some embodiments, the first impedance is at least twice an optimal load impedance of the main amplifier, and the second impedance is at least twice an optimal load impedance of the auxiliary amplifier.

In some embodiments, each stage impedance matching circuit of the at least one-stage impedance matching circuit of the main matching circuits includes a π-type three-element impedance matching circuit or a T-type three-element impedance matching circuit, and each stage impedance matching circuit of the multi-stage impedance matching circuit of the auxiliary matching circuit includes a π-type three-element impedance matching circuit or a T-type three-element impedance matching circuit.

In some embodiments, a phase of the main matching circuit at the combining node and a phase of the auxiliary matching circuit at the combining node are the same, the main matching circuit is configured to adjust the phase of the first amplified signal by 90 degrees, and the auxiliary matching circuit is configured to adjust the phase of the second amplified signal by 180 degrees.

In some embodiments, each stage impedance matching circuit of the at least one-stage impedance matching circuit of the main matching circuit includes a π-type three-element impedance matching circuit and each stage impedance matching circuit of the multi-stage impedance matching circuit of the auxiliary matching circuit includes a π-type three-element impedance matching circuit.

In some embodiments, the main matching circuit includes a one-stage impedance matching circuit. The one-stage impedance matching circuit includes a first capacitor, a first inductor, and a second capacitor. An output of the main amplifier is connected to a first end of the first capacitor and a first end of the first inductor. A second end of the first inductor and a first end of the second capacitor are connected to the combining node. A second end of the first capacitor and a second end of the second capacitor are both grounded. The auxiliary matching circuit includes a two-stage impedance matching circuit. The two-stage impedance matching circuit includes a third capacitor, a second inductor, a fourth capacitor, a fifth capacitor, a third inductor and a sixth capacitor. An output of the auxiliary amplifier is connected to a first end of the third capacitor and a first end of the second inductor. A second end of the second inductor is connected to a first end of the fourth capacitor, a first end of the fifth capacitor and a first end of the third inductor. A second end of the third inductor and a first end of the sixth capacitor are connected to the combining node. A second end of the third capacitor, a second end of the fourth capacitor, a second end of the fifth capacitor, and a second end of the sixth capacitor are all grounded.

In some embodiments, the impedance conversion circuit includes a first power supply, a fourth inductor, a seventh capacitor, and a fifth inductor. A first end of the first power supply is connected to a first end of the fourth inductor. A second end of the fourth inductor and a first end of the seventh capacitor are connected to the combining node. Both a second end of the seventh capacitor and a first end of the fifth inductor are connected to a load of the radio frequency power amplifier. A second end of the first power supply and a first end of the fifth inductor are grounded. The first power supply is configured to supply power to the main amplifier through the fourth inductor and the first inductor, and to supply power to the auxiliary amplifier through the fourth inductor, the third inductor and the second inductor.

In some embodiments, the fourth capacitor and the fifth capacitor are combined into a same capacitor, and the second capacitor and the sixth capacitor are combined into a same capacitor.

In some embodiments, the main amplifier, the auxiliary amplifier, the first capacitor, and the third capacitor are all integrated on a same chip. The impedance conversion circuit, the first inductor, the second capacitor, the second inductor, the fourth capacitor, the fifth capacitor, the third inductor, and the sixth capacitor are all arranged on a substrate coupled to the chip.

In some embodiments, each stage impedance matching circuit of the at least one-stage impedance matching circuit of the main matching circuit includes a T-type three-element impedance matching circuit and each stage impedance matching circuit of the multi-stage impedance matching circuit of the auxiliary matching circuit includes a T-type three-element impedance matching circuit.

In some embodiments, the main matching circuit includes a second power supply and a one-stage impedance matching circuit. The one-stage impedance matching circuit includes a sixth inductor, an eighth capacitor, and a seventh inductor. A first end of the second power supply is connected to a first end of the sixth inductor. A second end of the sixth inductor and a first end of the eighth capacitor are connected to an output of the main amplifier. Both a second end of the eighth capacitor and a first end of the seventh inductor are connected to the combining node. A second end of the second power supply and a second end of the seventh inductor are both grounded. The second power supply is configured to supply power to the main amplifier through the sixth inductor. The auxiliary matching circuit includes a third power supply and a two-stage impedance matching circuit. The two-stage impedance matching circuit includes an eighth inductor, a ninth capacitor, a ninth inductor, a tenth inductor, a tenth capacitor and an eleventh inductor. A first end of the third power supply is connected to a first end of the eighth inductor. A second end of the eighth inductor and a first end of the ninth capacitor are connected to an output of the auxiliary amplifier. A second end of the ninth capacitor is connected to a first end of the ninth inductor, a first end of the tenth inductor, a first end of the tenth capacitor. Both a second end of a tenth capacitor and a first end of the eleventh inductor are connected to the combining nodes. A second end of the third power supply, a second end of the ninth inductor, a second end of the tenth inductor, and a second end of the eleventh inductor are all grounded. The third power supply is configured to supply power to the auxiliary amplifier through the eighth inductor.

In some embodiments, the impedance conversion circuit includes a twelfth inductor, an eleventh capacitor, and a thirteenth inductor. A first end of the twelfth inductor and a first end of the eleventh capacitor are connected to the combining node. A second end of the eleventh capacitor and a first end of the thirteenth inductor are connected to a load of the radio frequency power amplifier. A second end of the twelfth inductor and a second end of the thirteenth inductor are grounded.

In some embodiments, the ninth inductor and the tenth inductor are combined into a same inductor, and the seventh inductor, the eleventh inductor, and the twelfth inductor are combined into a same inductor.

In some embodiments, the output impedance of the main amplifier is less than or equal to 5 ohms and the output impedance of the auxiliary amplifier is less than or equal to 5 ohms.

According to a second aspect, an embodiment of the present application provides an electronic device including the radio frequency power amplifier of any one of the embodiments of the first aspect.

In various embodiments of the present application, the following technical effects can be achieved: 1. The power added efficiency after the deep power back-off is improved, and a larger output power is still provided after the combining node; 2. By directly adding the main matching circuit between the main amplifier and the combining node, and directly adding the auxiliary matching circuit between the auxiliary amplifier and the combining node, the output impedance of the main amplifier and the output impedance of the auxiliary amplifier can be increased, the impedance at the combining node can be improved effectively, and the loss of the output circuit can be reduced, so as to increase the output efficiency, and to reduce the risk of the high sensitivity of the mass production.

DETAILED DESCRIPTION

Hereinafter, the present application will be described in more detail with reference to the accompanying drawings and implementations. It should be noted that following specific embodiments described in the present application are merely for illustration of the present application, and are not intended to limit the present application.

In mobile communication systems such as mobile phones, terminal products such as mobile phones mostly realize power amplification through Class B or Class AB power amplifier solutions.

For conventional RF power amplifiers, after high power back-off (or deep power back-off), the PAE decreases significantly and power consumption of the RF power amplifiers is greatly increased, which cannot meet requirements of the current mobile communication systems. In addition, with reduction of supply voltage, output power requirement for the conventional RF power amplifiers is increased again, and it is also required to increase the number of power tubes for the high-power output realized by multi-tube parallel connection, which further reduces its output impedance. A lower output impedance increases impedance sensitivity.

In addition, in low-voltage processes such as gallium arsenide (GaAs) or Silicon-On-Insulator (SOI), an output impedance of a main amplifier and an output impedance of an auxiliary amplifier in a conventional two-way Doherty power amplifier scheme are low, and an impedance Zc0 at a combining node in the conventional two-way Doherty power amplifier scheme is Ropt/2 (Ropt is an optimal load impedance of the main amplifier and the auxiliary amplifier) . Due to this low impedance, more sensitivity issues are introduced and bandwidth and insertion loss requirements of an impedance matching network (including a main matching circuit and a impedance conversion circuit) are increased.

In view of the above, embodiments of the present application provide a radio frequency power amplifier and an electronic device, for solving at least one technical problem existing in some implementations.

Figure 1A:
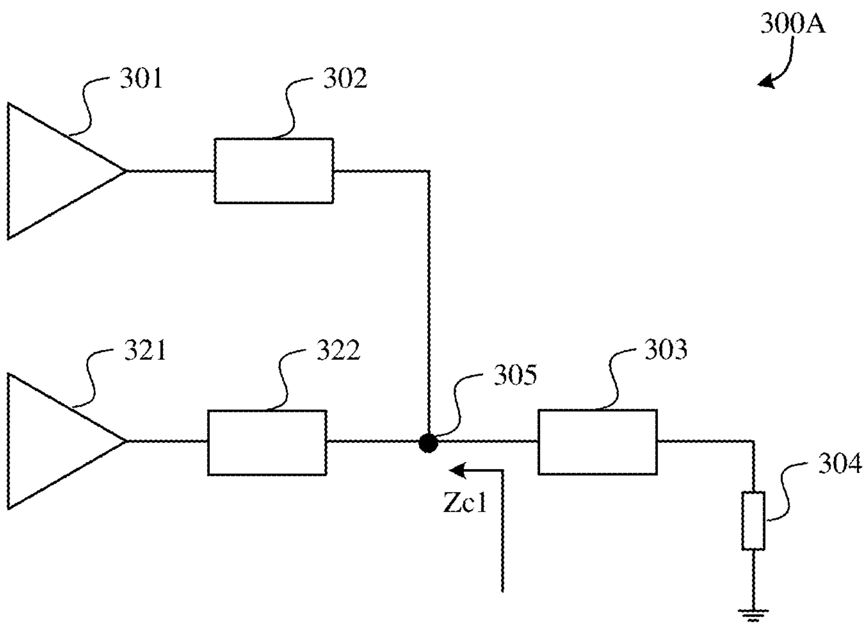
FIG. 1A is a first operating schematic of a first radio frequency power amplifier scheme according to an embodiment of the present application.
Figure 1B:
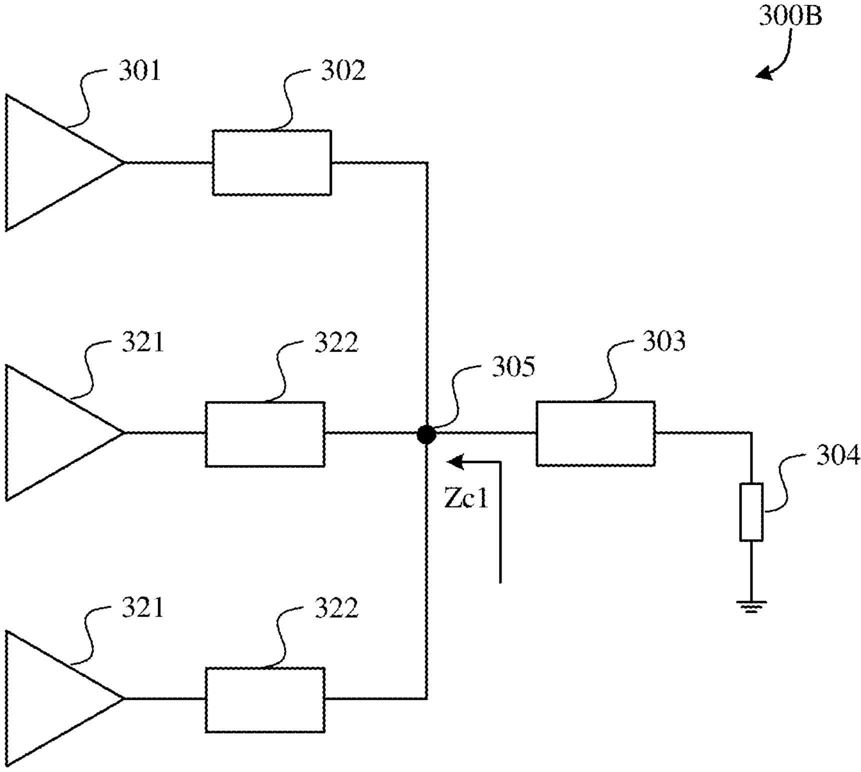
FIG. 1B is a second operating schematic of a first radio frequency power amplifier scheme according to an embodiment of the present application.

Referring to FIG. 1A, in a first aspect, an embodiment of the present application provides a radio frequency power amplifier 300A. The radio frequency power amplifier 300A includes a main amplifier 301, a main matching circuit 302, an auxiliary amplifier 321, an auxiliary matching circuit 322 and an impedance conversion circuit 303. The main amplifier 301 is configured to output a first amplified signal. The main matching circuit 302 is connected between the main amplifier 301 and a combining node 305, includes at least one-stage impedance matching circuit and is configured to adjust a phase of the first amplified signal and raise an output impedance of the main amplifier 301 to a first impedance. The auxiliary amplifier 321 is configured to output a second amplified signal. The auxiliary matching circuit 322 is connected between the auxiliary amplifier 321 and the combining node 305, includes a multi-stage impedance matching circuit and is configured to adjust a phase of the second amplified signal and raise an output impedance of the auxiliary amplifier 321 to the second impedance. The impedance at the combining node is a combined impedance of the first impedance and the second impedance, which is larger than the output impedance of the main amplifier 301 and the output impedance of the auxiliary amplifier 321. The impedance conversion circuit 303 is connected to the combining node 305 and is configured to raise the impedance at the combining node 305 to a transmission impedance.

In some embodiments, a radio frequency power amplifier may be configured as a combination of 2-way, 3-way, or more-way Doherty power amplifiers. Different numbers of multi-channel Doherty power amplifiers can be optionally configured according to different circuit designs. Exemplarily, referring to FIG. 1A, the radio frequency power amplifier 300A may be configured with two ways: the first way includes a main amplifier 301 and a main matching circuit 302 which are connected to a combining node 305, and the second way includes a secondary amplifier 321 and a secondary matching circuit 322 which are connected to the combining node 305.

In another example, a radio frequency power amplifier 300B illustrated with reference to FIG. 3B may be configured with three ways: the first way includes a main amplifier 301 and a main matching circuit 302 which are connected to a combining node 305, the second way includes an auxiliary amplifier 321 and an auxiliary matching circuit 322 which are connected to the combining node 305, and the third way includes a circuit connected to the combining node 305 and having a configuration which is the same as the configuration of the auxiliary amplifier 321 and the auxiliary matching circuit 322.

In some embodiments, the first impedance is at least twice an optimal load impedance Ropt_m of the main amplifier 301 and the second impedance is at least twice an optimal load impedance Ropt_p of the auxiliary amplifier 321. In some specific embodiments, the first impedance is a first multiple of the optimal load impedance Ropt_m of the main amplifier 301, and the second impedance is a second multiple of the optimal load impedance Ropt_p of the auxiliary amplifier 321. The first multiple may be the same as or different from the second multiple. For example, the first impedance is 3Ropt_m and the second impedance is 3 Ropt_p. For another example, the first impedance is 4 Ropt_m, and the second impedance is 2 Ropt_p. For another example, the first impedance is 2 Ropt_m or 5 Ropt_m, and the second impedance is 4 Ropt_p, 5Ropt_p, or the like. It should be noted that the first multiple and the second multiple may be non-integers, for example, 2.5, 3.2, 4.8, or the like.

It should be noted that components/circuits/nodes/impedances and the like identified by a same reference number in FIGS. 1A to 1F are understood as the same or similar components/circuits/nodes/impedances. The module structures in each of FIGS. 1A to 1F may be interchangeable, and the impedance matching structure of each module may be fully or partially provided as an adjustable structure to perform switching when different frequency bands are switched.

Here and below, a two-way Doherty power amplifier scheme will be described as an example, and the two-way Doherty power amplifier scheme is not used to limit the embodiments of the present application.

Referring to FIG. 1A, an operation principle of the radio frequency power amplifier 300A is as follows. When the power is low, the main amplifier 301 is turned on and the auxiliary amplifier 321 is turned off. The auxiliary amplifier 321 realizes the open circuit characteristic since it operates in Class C and is not turned on. The auxiliary matching circuit 322 keeps the phase of the auxiliary amplifier 321 constant and raises the output impedance of the auxiliary amplifier 321, which maintains the Class C open circuit characteristic of the auxiliary amplifier 321, and therefore the output impedance of the auxiliary amplifier 321 is infinite. The main amplifier 301 operates in Class AB, and the main matching circuit 302 adjusts the phase of the main amplifier 301 and raises the output impedance of the main amplifier 301, so that the output impedance under high impedance is Rmod (the load modulation impedance Rmod is high impedance at low power). At this time, the main matching circuit 302 has high efficiency and good linearity. At high power, the auxiliary amplifier 321 is turned on, and the output impedance of the main amplifier 301 is converted from Rmod to 4 Ropt_m (Ropt_m is the optimal load impedance of the main amplifier 301) due to the pull of the active load of the auxiliary amplifier 321. The output impedance of the auxiliary amplifier 321 after the auxiliary matching circuit 321 becomes 4 Ropt_p (Ropt_p is the optimal load impedance of the auxiliary amplifier 321). At this time, the main amplifier 301 and the auxiliary amplifier 321 output at high power together, and the impedance Zc1 at the combining node 305 is converted from the conventional Ropt/2 (Ropt is the optimal load impedance of the main amplifier 301 and the auxiliary amplifier 321) to 2 Ropt. The impedance conversion circuit 303 is configured to raise the impedance Zc1 at the combining node 305 to the transmission impedance, that is, to convert it into a 50 ohm output load. In this way, the RF power amplifier using Doherty technology effectively realizes the improvement of power added efficiency after deep power back-off, and has a larger bandwidth.

In some embodiments, the main amplifier 301 operates in class AB, the auxiliary amplifier 321 operates in class C, the main amplifier 301 is turned on and the auxiliary amplifier 321 is turned off when the power is low, and the auxiliary amplifier 321 is turned on when the power is high. A difference between a phase of an input signal of the main amplifier 301 and a phase of an input signal of the auxiliary amplifier 321 is 90 degrees. The main matching circuit 302 and the auxiliary matching circuits 322 have a same phase at the combining node 305.

In some embodiments, each stage impedance matching circuit of at least one-stage impedance matching circuit of the main matching circuit 302 includes a π-type three-element impedance matching circuit or a T-type three-element impedance matching circuit. Each stage impedance matching circuit of the multi-stage impedance matching circuit of the auxiliary matching circuit 322 includes a π-type three-element impedance matching circuit or a T-type three-element impedance matching circuit.

Figure 2A:
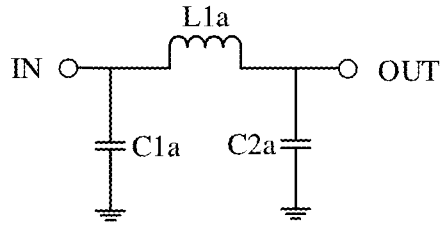
FIG. 2A is an operating schematic of a one-stage T-type three-element impedance matching circuit according to an embodiment of the present application.

A one-stage π-type three-element impedance matching circuit may be formed by one inductor and two capacitors. For example, referring to FIG. 2A, the π-type three-element impedance matching circuit may be formed by a first capacitor C1*a*, a first inductor L1*a*, and a second capacitor C2*a*. A first end of the first capacitor C1*a* and a first end of the first inductor L1*a* are connected and serve as an input IN of the π-type three-element impedance matching circuit. A first end of the second capacitor C2*a* and a second end of the first inductor L1*a* are connected and serve as an output OUT of the π-type three-element impedance matching circuit. Both a second end of the first capacitor C1*a* and a second end of the second capacitor C2*a* are grounded.

Figure 2B:
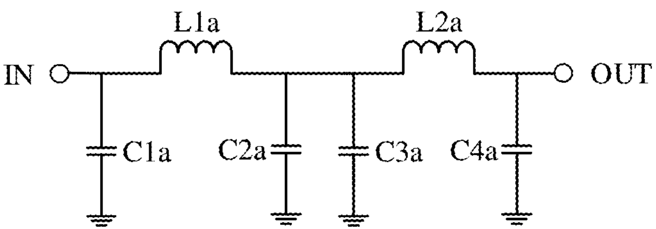
FIG. 2B is a first operating schematic of a two-stage π-type three-element impedance matching circuit according to an embodiment of the present application.
Figure 2C:
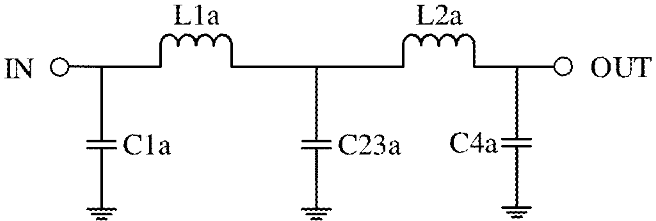
FIG. 2C is a second operating schematic of a two-stage π-type three-element impedance matching circuit according to an embodiment of the present application.

A two-stage π-type three-element impedance matching circuit includes a first-stage π-type three-element impedance matching circuit and a second-stage π-type three-element impedance matching circuit in cascade, and may be formed by two inductors and four capacitors. Exemplarily, referring to FIG. 2B, the first-stage π-type three-element impedance matching circuit may be formed by a first capacitor C1*a*, a first inductor L1*a*, and a second capacitor C2*a*. A first end of the first capacitor C1*a* and a first end of the first inductor L1*a* are connected and serve as an input IN of the two-stage π-type three-element impedance matching circuit. A first end of the second capacitor C2*a* is connected to a second end of the first inductor L1*a*. A second end of the first capacitor C1*a* and a second end of the second capacitor C2*a* are grounded. The second-stage π-type three-element impedance matching circuit may be formed by a third capacitor C3*a*, a second inductor L2*a* and a fourth capacitor C4*a*. A first end of the third capacitor C3*a* is connected to a first end of the second inductor L2*a*. A first end of the fourth capacitor C4*a* and a second end of the second inductor L2*a* are connected and serve as an output OUT of the two-stage π-type three-element impedance matching circuit. A second end of the third capacitor C3*a* and a second end of the fourth capacitor C4*a* are grounded. The second capacitor C2*a* and the third capacitor C3*a* may be equivalent to one capacitor (referring to the fifth capacitor C23*a* in FIG. 2C). The one capacitor (referring to the fifth capacitor C23*a* in FIG. 2C) may be a common capacitor of the first stage π-type three-element impedance matching circuit and the second stage π-type three-element impedance matching circuit.

Figure 3A:
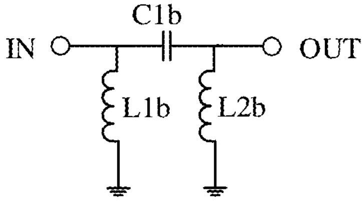
FIG. 3A is an operating schematic of a one-stage T-type three-element impedance matching circuit according to an embodiment of the present application.

Referring to FIG. 3A, a one-stage T-type three-element impedance matching circuit may be formed by one capacitor C1*b* and two inductors L1*b*, L2*b*.

Figure 3B:
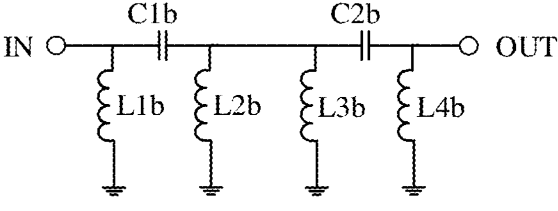
FIG. 3B is a first operating schematic of a two-stage T-type three-element impedance matching circuit according to an embodiment of the present application.
Figure 3C:
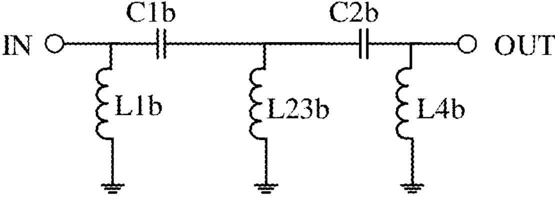
FIG. 3C is a second operating schematic of a two-stage T-type three-element impedance matching circuit according to an embodiment of the present application.

Referring to FIG. 3B, a two-stage T-type three-element impedance matching circuit includes a first-stage T-type three-element impedance matching circuit and a second-stage T-type three-element impedance matching circuit in cascade, and may be formed by two capacitors C1*b*, C2*b* and four inductors L1*b*, L2*b*, L3*b*, L4*b*. The inductor L1*b* and the inductor L3*b* may be equivalent to one inductor (referring to the inductor L23*b* shown in FIG. 3C). The one inductor (referring to the inductor L23*b* shown in FIG. 3C) may be used as a common inductor of the first-stage T-type three-element impedance matching circuit and the second-stage T-type three-element impedance matching circuit. That is, the T-type three-element impedance matching circuits shown in FIG. 3A, FIG. 3B, and FIG. 3C can be understood by replacing the capacitors with inductors and replacing the inductors with capacitors, respectively, in the π-type three-element impedance matching circuits shown in FIG. 2A, FIG. 2B, and FIG. 2C, and details will not be repeatedly described here.

In the current mobile communication system, due to the high frequency, capacitance values and inductor values of lumped devices change greatly with the frequency. In the embodiments of the present application, the main matching circuit is at least one-stage three-element impedance matching circuit and the auxiliary matching circuit is a multi-stage three-element impedance matching circuit, which can improve the bandwidth. The auxiliary matching circuit reduces the capacitance through the multi-stage three-element impedance matching circuit, which reduces the drastic change of the capacitance value with the frequency in a wide bandwidth.

In some embodiments, the main matching circuit and the auxiliary matching circuit have a same phase at the combining node. The main matching circuit adjusts the phase of the first amplified signal by 90 degrees, and the auxiliary matching circuit adjusts the phase of the second amplified signal by 180 degrees.

In the embodiments of the present application, the main matching circuit 302 raises the output impedance of the main amplifier 301 to the first impedance while adjusting the phase of the first amplified signal. The phase angle of the main amplifier 301 is 90 degrees when viewed from the combining node 305. The auxiliary matching circuit 322 raises the output impedance of the auxiliary amplifier 321 to the second impedance while adjusting the phase of the second amplified signal. The phase angle of the auxiliary amplifier 321 is 180 degrees when viewed from the combining node 305.

Figure 1C:
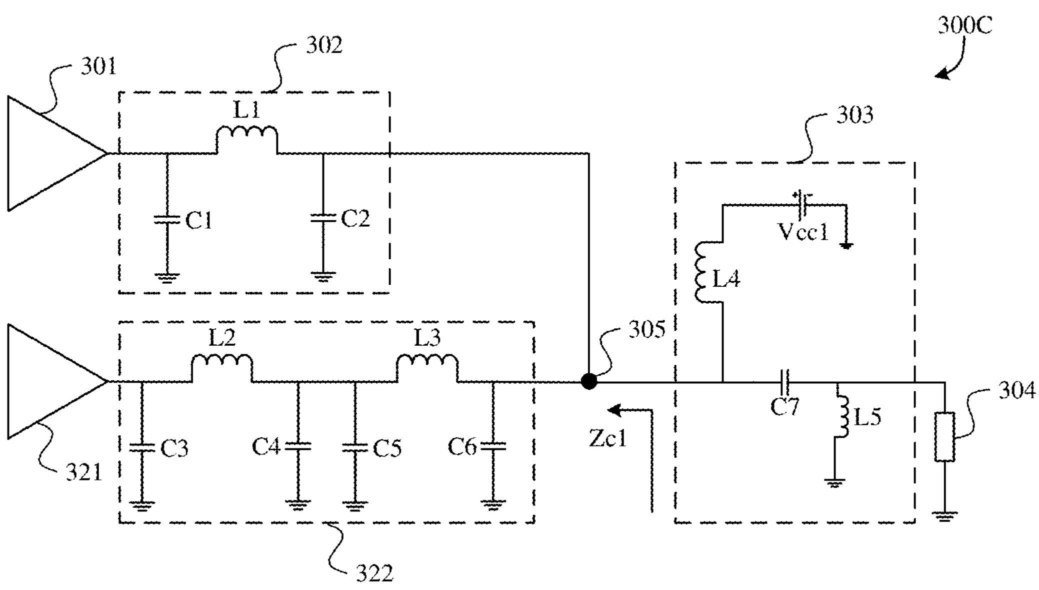
FIG. 1C is a third operating schematic of a first radio frequency power amplifier scheme according to an embodiment of the present application.

Referring to a radio frequency power amplifier 300C shown in FIG. 1C, in some embodiments, each stage impedance matching circuit of the at least one-stage impedance matching circuit of the main matching circuit 302 includes a π-type three-element impedance matching circuit and each stage impedance matching circuit of the multi-stage impedance matching circuit of the auxiliary matching circuit 322 includes a π-type three-element impedance matching circuit.

In some specific embodiments, the main matching circuit 302 includes at least one-stage π-type three-element impedance matching circuit and the auxiliary matching circuit 322 includes an even-stage π-type three-element impedance matching circuit. The even-stage π-type three-element impedance matching circuit includes a first-stage π-type three-element impedance matching circuit to a 2Nth-stage π-type three-element impedance matching circuit in cascade, where N is a natural number. For example, the main matching circuit 302 is a one-stage π-type three-element impedance matching circuit and the auxiliary matching circuit 322 is a two-stage π type three-element impedance matching circuit.

Referring to the radio frequency power amplifier 300C shown in FIG. 1C, in some embodiments, the main matching circuit 302 includes a one-stage impedance matching circuit. The one-stage impedance matching circuit includes a first capacitor C1, a first inductor L1, and a second capacitor C2. An output of the main amplifier 301 is connected to a first end of the first capacitor C1 and a first end of the first inductor L1. A second end of the first inductor L1 and a first end of the second capacitor C2 are connected to the combining node 305. Both a second end of the first capacitor C1 and a second end of the second capacitor C2 are grounded. The auxiliary matching circuit 322 includes a two-stage impedance matching circuit. The two-stage impedance matching circuit includes a third capacitor C3, a second inductor L2, a fourth capacitor C4, a fifth capacitor C5, a third inductor L3 and a sixth capacitor C6. An output of the auxiliary amplifier 321 is connected to a first end of the third capacitor C3 and a first end of the second inductor L2. A second end of the second inductor L2 is connected to a first end of the fourth capacitor C4, a first end of the fifth capacitor C5 and a first end of the third inductor L3. A second end of the third inductor L3 and a first end of the sixth capacitor C6 are connected to the combining node 305. A second end of the third capacitor C3, a second end of the fourth capacitor C4, a second end of the fifth capacitor C5, and a second end of the sixth capacitor C6 are all grounded.

In this way, the auxiliary matching circuit 322 is a two-stage π-type three-element impedance matching circuit, which includes a first-stage π-type three-element impedance matching circuit composed of a third capacitor C3, a second inductor L2, and a fourth capacitor C4 of the auxiliary matching circuit 322 and a second-stage π-type three-element impedance matching circuit composed of a fifth capacitor C5, a third inductor L3, and a sixth capacitor C6 of the auxiliary matching circuit 322. The two-stage π-type three-element impedance matching circuit constitutes an impedance rising structure with a phase of 180 degrees. The third capacitor C3, the second inductor L2, and the fourth capacitor C4 raise an output impedance of the auxiliary amplifier 321 and change a phase by 90 degrees. The fifth capacitor C5, the third inductor L3, and the sixth capacitor C6 change the phase by 90 degrees.

Referring to FIG. 1C, in some embodiments, the impedance conversion circuit 303 includes a first power supply Vcc1, a fourth inductor L4, a seventh capacitor C7, and a fifth inductor L5. A first end of the first power supply Vcc1 is connected to a first end of the fourth inductor L4. A second end of the fourth inductor L4 and a first end of the seventh capacitor C7 are connected to the combining node 305. A second end of the seventh capacitor C7 and a first end of the fifth inductor L5 are connected to a load 304 of the radio frequency power amplifier. A second end of the first power supply Vcc1 and a first end of the fifth inductor L5 are grounded. The first power supply Vcc1 supplies power to the main amplifier 301 through the fourth inductor L4 and the first inductor L1 and supplies power to the auxiliary amplifier 321 through the fourth inductor L4, the third inductor L3 and the second inductor L2.

In the embodiments of the present application, the first power supply Vcc1 and the fourth inductor L4 are multiplexed. The fourth inductor L4 isolates the radio frequency signal from a first power supply Vcc1 signal which is a direct current (DC). The fourth inductor L4, the seventh capacitor C7 and the fifth inductor L5 of the impedance conversion circuit 303 constitute a π-type three-element impedance matching circuit. The first power supply Vcc1 supplies power to both the main amplifier 301 and the auxiliary amplifier 321 through the fourth inductor L4.

Figure 1D:
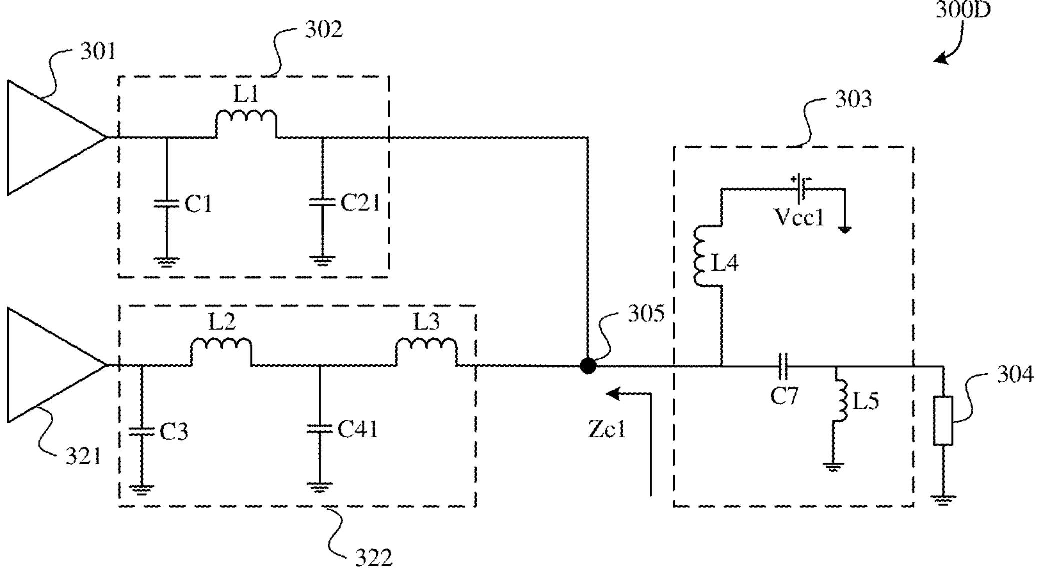
FIG. 1D is a fourth operating schematic of a first radio frequency power amplifier scheme according to an embodiment of the present application.

Referring to the radio frequency power amplifier 300C shown in FIG. 1C and a radio frequency power amplifier 300D shown in FIG. 1D, in some embodiments, the fourth capacitor C4 (referring to FIG. 1C) and the fifth capacitor (referring to FIG. 1C) C5 are combined into a same capacitor (referring to a thirteenth capacitor C41 in FIG. 1D). The second capacitor C2 (referring to FIG. 1C) and the sixth capacitor C6 (referring to FIG. 1C) are combined into a same capacitor (referring to a twelfth capacitor C21 in FIG. 1D).

Referring to FIG. 1C, in some embodiments, the main amplifier 301, the auxiliary amplifier 321, the first capacitor C1, and the third capacitor C3 are all integrated on a same chip, and the impedance conversion circuit 303, the first inductor L1, the second capacitor C2, the second inductor L2, the fourth capacitor C4, the fifth capacitor C5, the third inductor L3, and the sixth capacitor C6 are all arranged on a substrate coupled to the chip.

Referring to FIG. 1D, in some embodiments, the main amplifier 301, the auxiliary amplifier 321, the first capacitor C1, and the third capacitor C3 are all integrated on a same chip, and the impedance conversion circuit 303, the first inductor L1, the twelfth capacitor C21, the second inductor L2, the thirteenth capacitor C41 and the third inductor L3 are arranged on a substrate coupled to the chip.

In some specific embodiments, the first inductor L1, the second inductor L2, the third inductor L3, and the fourth inductor L4 and the fifth inductor L5 of the impedance conversion circuit 303 may be formed by winding wires on a substrate. For the current mobile communication system, due to the high frequency, capacitance values and inductance values of lumped devices change greatly with the frequency. The first inductor L1, the second inductor L2, the third inductor L3, and the fourth inductor L4 and the fifth inductor L5 of the impedance conversion circuit 303 are realized through on-chip winding, which effectively reduces the risk of the large difference in performance and production fluctuation at high, medium and low frequencies.

The radio frequency power amplifiers provided by the embodiments of the present application effectively reduce the risk of cost and production fluctuation and meet the requirements of important indicators such as low cost and miniaturization of the radio frequency power amplifier.

Figure 1E:
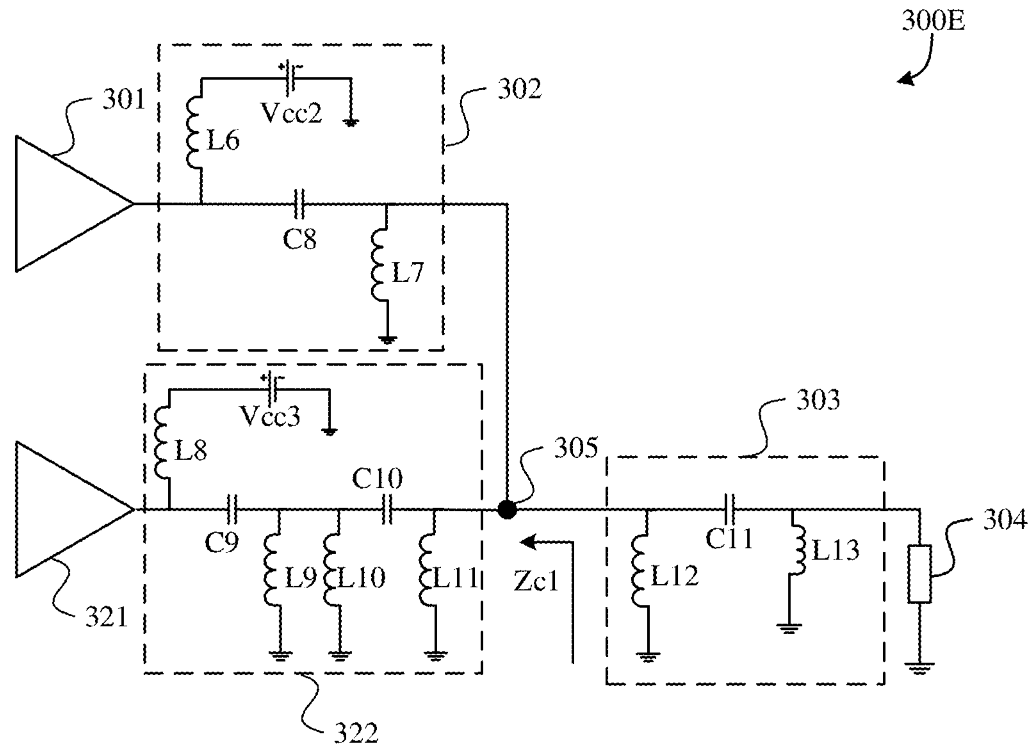
FIG. 1E is a fifth operating schematic of a first radio frequency power amplifier scheme according to an embodiment of the present application.

Referring to a radio frequency power amplifier 300E shown in FIG. 1E, in some embodiments, each stage impedance matching circuit of the at least one-stage impedance matching circuit of the main matching circuit 302 includes a T-type three-element impedance matching circuit and each stage impedance matching circuit of the multi-stage impedance matching circuit of the auxiliary matching circuit 322 includes a T-type three-element impedance matching circuit.

In some specific embodiments, the main matching circuit 302 includes at least one-stage T-type three-element impedance matching circuit and the auxiliary matching circuit 322 includes an even-numbered T-type three-element impedance matching circuit. The even-numbered T-type three-element impedance matching circuit includes a first-stage T-type three-element impedance matching circuit to a 2Nth-stage T-type three-element impedance matching circuit in cascade, where N is a natural number. For example, the main matching circuit 302 is a one-stage T-type three-element impedance matching circuit, and the auxiliary matching circuit 322 is a two-stage T-type three-element impedance matching circuit. Specific details of the T-type three-element impedance matching circuit can be found in the above description with respect to the relevant portions of FIGS. 3A, 3B, and 3C, and will not be repeated here.

In the current mobile communication system, due to the high frequency, capacitance values and inductor values of lumped devices change greatly with the frequency. In the embodiments of the present application, the main matching circuit is at least one-stage three-element impedance matching circuit and the auxiliary matching circuit is a multi-stage three-element impedance matching circuit, so that the bandwidth can be improved. The auxiliary matching circuit reduces the capacitance through a multi-stage three-element impedance matching circuit, which reduces the drastic change of the capacitance value with the frequency in a wide bandwidth.

Referring to FIG. 1E, in some embodiments, the main matching circuit 302 includes a second power supply Vcc2 and a one-stage impedance matching circuit. The one-stage impedance matching circuit includes a sixth inductor L6, an eighth capacitor C8, and a seventh inductor L7. A first end of the second power supply Vcc2 is connected to a first end of the sixth inductor L6. A second end of the sixth inductor L6 and a first end of the eighth capacitor C8 are connected to an output of the main amplifier 301. Both a second end of the eighth capacitor C8 and a first end of the seventh inductor L7 are connected to the combining node 305. A second end of the second power supply Vcc2 and a second end of the seventh inductor L7 are grounded. The second power supply Vcc2 supplies power to the main amplifier 301 through the sixth inductor L6. The auxiliary matching circuit 322 includes a third power supply Vcc3 and a two-stage impedance matching circuit. The two-stage impedance matching circuit includes an eighth inductor L8, a ninth capacitor C9, a ninth inductor L9, a tenth inductor L10, a tenth capacitor C10, and an eleventh inductor L11. A first end of the third power supply Vcc3 is connected to a first end of the eighth inductor L8. A second end of the eighth inductor L8 and a first end of the ninth capacitor C9 are connected to an output of the auxiliary amplifier 321. A second end of the ninth capacitor C9 is connected to a first end of the ninth inductor L9, a first end of the tenth inductor L10 and a first end of the tenth capacitor C10. A second end of the tenth capacitor C10 and a first end of the eleventh inductor L11 are connected to the combining node 305. A second end of the third power supply Vcc3, a second end of the ninth inductor L9, a second end of the tenth inductor L10, and a second end of the eleventh inductor L11 are grounded. The third power supply Vcc3 supplies power to the auxiliary amplifier 321 through the eighth inductor L8.

Referring to FIG. 1E, in some embodiments, the impedance conversion circuit 303 includes a twelfth inductor L12, an eleventh capacitor C11, and a thirteenth inductor L13. A first end of the twelfth inductor L12 and a first end of the eleventh capacitor C11 are connected to the combining node 305. Both a second end of the eleventh capacitor C11 and a first end of the thirteenth inductor L13 are connected to the load 304 of the radio frequency power amplifier. A second end of the twelfth inductor L12 and a second end of the thirteenth inductor L13 are grounded.

Figure 1F:
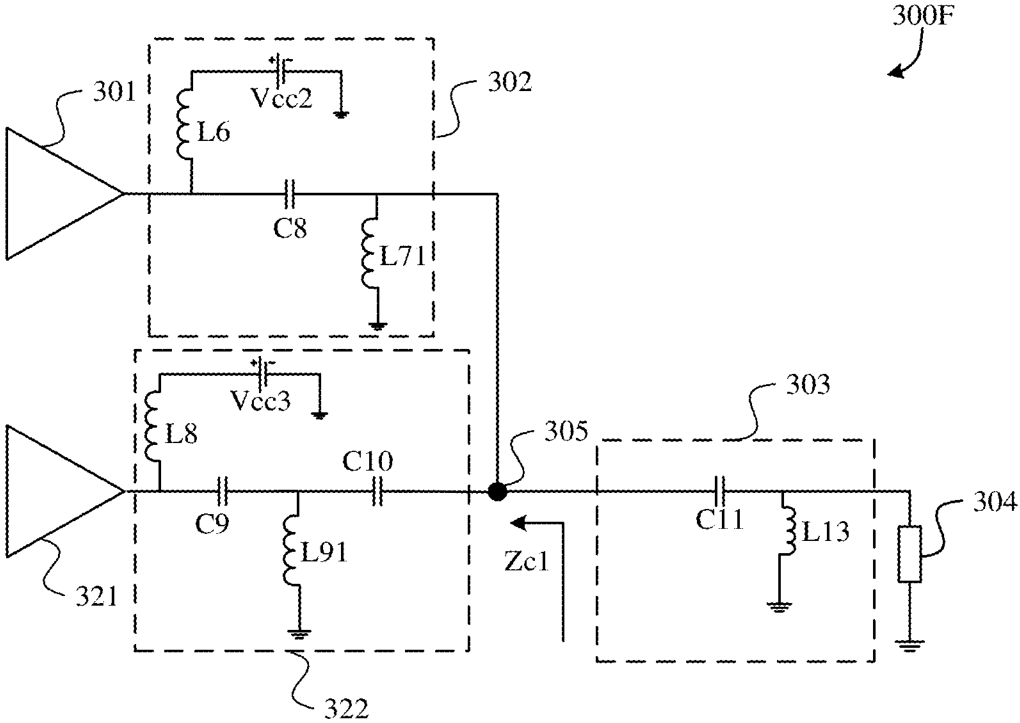
FIG. 1F is a sixth operating schematic of a first radio frequency power amplifier scheme according to an embodiment of the present application.

Referring to FIGS. 1E and 1F, in some embodiments, the ninth inductor L9 (referring to FIG. 1E) and the tenth inductor L10 (referring to FIG. 1E) are combined into a same inductor (referring to a fifteenth inductor L91 in FIG. 1F), and the seventh inductor L7, the eleventh inductor L11, and the twelfth inductor L12 are combined into a same inductor (referring to s fourteenth inductor L71 of FIG. 1F).

Referring to FIGS. 1A-1F, in some embodiments, both the output impedance of the main amplifier 301 and the output impedance of the auxiliary amplifier 321 are less than or equal to 5 ohms, for example, 3 ohms, 4 ohms, etc. In some embodiments, both the output impedance of the main amplifier 301 and the output impedance of the auxiliary amplifier 321 are less than 3 ohms.

The radio frequency power amplifiers provided by the embodiment of the present application are suitable for radio frequency power amplifiers manufactured by a low-voltage process such as GaAs or SOI, Herein, in the radio frequency power amplifier manufactured by the low-voltage process, both the output impedance of the main amplifier and the output impedance of the auxiliary amplifier are less than or equal to 5 ohms.

Referring to FIG. 1F, in some embodiments, the radio frequency power amplifier 300F further includes an input of the radio frequency power amplifier (not shown in FIG. 1F), a drive amplifier (not shown in FIG. 1F), a power divider (not shown in FIG. 1F). Herein, the input of the radio frequency power amplifier 300F transmits an input signal to the driving amplifier, the driving amplifier distributes the driven output signal into two independent ways through the power divider (not shown in FIG. 1F), and the two ways of independent signals respectively pass through two amplifiers. One of the two amplifiers is the main amplifier 301 and the other is the auxiliary amplifier 321.

Referring to FIG. 1F, in some embodiments, the radio frequency power amplifier 300F further includes an output of the radio frequency power amplifier 300F (not shown in FIG. 1F). The load 304 is located between the output of the radio frequency power amplifier 300F and the ground, and the impedance of the load 304 is 50 ohms.

In various embodiments of the present application, the following technical effects can be achieved: 1. The power added efficiency after the deep power back-off is improved, and a larger output power is still provided after the combining node; 2. By directly adding the main matching circuit between the main amplifier and the combining node, and directly adding the auxiliary matching circuit between the auxiliary amplifier and the combining node, the output impedance of the main amplifier and the output impedance of the auxiliary amplifier can be increased, the impedance at the combining node can be improved effectively, and the loss of the output circuit can be reduced, so as to increase the output efficiency, and to reduce the risk of the high sensitivity of the mass production.

According to a second aspect, an embodiment of the present application provides an electronic device including the radio frequency power amplifier in any one of the embodiments in the first aspect.

Exemplarily, the radio frequency power amplifier includes a main amplifier, a main matching circuit, an auxiliary amplifier, an auxiliary matching circuit and an impedance conversion circuit. The main amplifier is configured to output a first amplified signal. The main matching circuit is connected between the main amplifier and a combining node, including at least one-stage impedance matching circuit and is configured to adjust a phase of the first amplified signal and raise an output impedance of the main amplifier to a first impedance. The auxiliary amplifier is configured to output a second amplified signal. The auxiliary matching circuit is connected between the auxiliary amplifier and the combining node, including a multi-stage impedance matching circuit and is configured to adjust a phase of the second amplified signal and raise an output impedance of the auxiliary amplifier to a second impedance. The impedance at the combining node is a combined impedance of the first impedance and the second impedance and is larger than an output impedance of the main amplifier and an output impedance of the auxiliary amplifier. The impedance conversion circuit is connected to the combining node and is configured to raise the impedance at the combining node to a transmission impedance.

In several embodiments provided in the application, it should be understood that the disclosed devices and methods may be implemented in other ways. The device embodiments described above are merely schematic. For example, the division of units is only a logical function division. In actual implementation, there may be other division methods, for example, multiple units or components may be combined, or may be integrated into another system, or some features may be ignored, or may not be implemented. Additionally, the coupling, or direct coupling, or communication connection between the components shown or discussed may be indirect coupling or communication connection through some interface, devices or units, and may be coupled electrically, mechanically, or otherwise.

The units described above as separate components may or may not be physically separated, and the components displayed as units may or may not be physical units. They can be located in one place or distributed among multiple network elements. Some or all of the units may be selected according to actual needs to achieve the purpose of the solution of the present embodiments.

In addition, in various embodiments of the present application, all functional units may be integrated into one processing unit, each unit may be separately used as one unit, or two or more units may be integrated into one unit. The above integrated unit may be implemented in the form of hardware or in the form of hardware plus software functional units.

It is to be appreciated that references throughout the specification to "one embodiment" or "an embodiment" mean that a particular feature, structure, or characteristic related to the embodiment is included in at least one embodiment of the present application. Thus, appearances of "in one embodiment" or "in an embodiment" throughout the specification do not necessarily refer to the same embodiment. Furthermore, these particular features, structures, or characteristics may be incorporated in any suitable manner in one or more embodiments. It should be appreciated that in various embodiments of the present application, the sequence numbers of the above-described processes do not mean the sequence of execution, and the sequence of execution of various processes should be determined by its function and internal logic, and should not constitute any limitation on the implementation order of the embodiments of the present application. The above-described serial numbers of the embodiments of the present application are for the purpose of description only, and do not represent the advantages and disadvantages of the embodiments.

It should be noted that, herein, the terms "comprising," "including," or any other variation thereof are intended to encompass a non-exclusive inclusion such that a process, method, article, or apparatus that includes a series of elements includes not only those elements, but also other elements that are not explicitly listed, or elements inherent to such a process, method, article, or apparatus. Without further limitation, an element defined by the statement "including a" does not preclude the presence of additional identical elements in a process, method, article, or apparatus that includes the element.

The foregoing includes only embodiments of the present application, but the scope of protection of the present application is not limited thereto, and any person skilled in the art can easily conceive of changes or substitutions within the technical scope disclosed in the present application, and should be covered within the scope of protection of the present application.

We claim:

1. A radio frequency power amplifier, comprising:

a main amplifier configured to output a first amplified signal;

a main matching circuit directly connected between the main amplifier and a combining node, comprising at least one-stage impedance matching circuit and configured to adjust a phase of the first amplified signal and raise an output impedance of the main amplifier to a first impedance;

an auxiliary amplifier configured to output a second amplified signal;

an auxiliary matching circuit directly connected between the auxiliary amplifier and the combining node, comprising a multi-stage impedance matching circuit and configured to adjust a phase of the second amplified signal and raise an output impedance of the auxiliary amplifier to a second impedance, wherein an impedance at the combining node is a combined impedance of the first impedance and the second impedance, which is greater than the output impedance of the main amplifier and the output impedance of the auxiliary amplifier thereby improving an impedance bandwidth; and an impedance conversion circuit directly connected to the combining node and configured to raise the impedance at the combining node to a transmission impedance thereby improving power added efficiency after deep power back-off;

wherein the auxiliary matching circuit is configured to adjust the phase of the second amplified signal by 180 degrees.

2. The radio frequency power amplifier of claim 1, wherein the first impedance is at least twice an optimal load impedance of the main amplifier and the second impedance is at least twice an optimal load impedance of the auxiliary amplifier.

3. The radio frequency power amplifier of claim 1, wherein each stage impedance matching circuit of the at least one-stage impedance matching circuit of the main matching circuit comprises a $\pi$-type three-element impedance matching circuit or a T-type three-element impedance matching circuit, and each stage impedance matching circuit of the multi-stage impedance matching circuit of the auxiliary matching circuit comprises a $\pi$-type three-element impedance matching circuit or a T-type three-element impedance matching circuit.

4. The radio frequency power amplifier of claim 3, wherein a phase of the main matching circuit at the combining node and a phase of the auxiliary matching circuit at the combining node are same, the main matching circuit is configured to adjust the phase of the first amplified signal by 90 degrees.

5. The radio frequency power amplifier of claim 4, wherein each stage impedance matching circuit of the at least one-stage impedance matching circuit of the main matching circuit comprises a π-type three-element impedance matching circuit and each stage impedance matching circuit of the multi-stage impedance matching circuit of the auxiliary matching circuit comprises a π-type three-element impedance matching circuit.

6. The radio frequency power amplifier of claim 5, wherein the main matching circuit comprises a one-stage impedance matching circuit, and the one-stage impedance matching circuit comprises a first capacitor, a first inductor, and a second capacitor, wherein an output of the main amplifier is connected to a first end of the first capacitor and a first end of the first inductor, a second end of the first inductor and a first end of the second capacitor are connected to the combining node, and a second end of the first capacitor and a second end of the second capacitor are both grounded, the auxiliary matching circuit comprises a two-stage impedance matching circuit, and the two-stage impedance matching circuit comprises a third capacitor, a second inductor, a fourth capacitor, a fifth capacitor, a third inductor and a sixth capacitor, wherein an output of the auxiliary amplifier is connected to a first end of the third capacitor and a first end of the second inductor, a second end of the second inductor is connected to a first end of the fourth capacitor, a first end of the fifth capacitor and a first end of the third inductor, a second end of the third inductor and a first end of the sixth capacitor are connected to the combining node, and a second end of the third capacitor, a second end of the fourth capacitor, a second end of the fifth capacitor, and a second end of the sixth capacitor are all grounded.

7. The radio frequency power amplifier of claim 6, wherein the impedance conversion circuit comprises a first power supply, a fourth inductor, a seventh capacitor, and a fifth inductor, wherein a first end of the first power supply is connected to a first end of the fourth inductor, a second end of the fourth inductor and a first end of the seventh capacitor are connected to the combining node, both a second end of the seventh capacitor and a first end of the fifth inductor are connected to a load of the radio frequency power amplifier, and a second end of the first power supply and a first end of the fifth inductor are grounded, the first power supply is configured to supply power to the main amplifier through the fourth inductor and the first inductor, and to supply power to the auxiliary amplifier through the fourth inductor, the third inductor and the second inductor.

8. The radio frequency power amplifier of claim 6, wherein the fourth capacitor and the fifth capacitor are combined into a same capacitor and the second capacitor and the sixth capacitor are combined into a same capacitor.

9. The radio frequency power amplifier of claim 6, wherein the main amplifier, the auxiliary amplifier, the first capacitor, and the third capacitor are all integrated on a same chip, and the impedance conversion circuit, the first inductor, the second capacitor, the second inductor, the fourth capacitor, the fifth capacitor, the third inductor, and the sixth capacitor are all arranged on a substrate coupled to the chip.

10. The radio frequency power amplifier of claim 4, wherein each stage impedance matching circuit of the at least one-stage impedance matching circuit of the main matching circuit comprises a T-type three-element impedance matching circuit and each stage impedance matching circuit of the multi-stage impedance matching circuit of the auxiliary matching circuit comprises a T-type three-element impedance matching circuit.

11. The radio frequency power amplifier of claim 10, wherein the main matching circuit comprises a second power supply and a one-stage impedance matching circuit, and the one-stage impedance matching circuit comprises a sixth inductor, an eighth capacitor, and a seventh inductor, wherein a first end of the second power supply is connected to a first end of the sixth inductor, a second end of the sixth inductor and a first end of the eighth capacitor are connected to an output of the main amplifier, both a second end of the eighth capacitor and a first end of the seventh inductor are connected to the combining node, and a second end of the second power supply and a second end of the seventh inductor are both grounded, wherein the second power supply is configured to supply power to the main amplifier through the sixth inductor, the auxiliary matching circuit comprises a third power supply and a two-stage impedance matching circuit, and the two-stage impedance matching circuit comprises an eighth inductor, a ninth capacitor, a ninth inductor, a tenth inductor, a tenth capacitor and an eleventh inductor, wherein a first end of the third power supply is connected to a first end of the eighth inductor, a second end of the eighth inductor and a first end of the ninth capacitor are connected to an output of the auxiliary amplifier, a second end of the ninth capacitor is connected to a first end of the ninth inductor, a first end of the tenth inductor, a first end of the tenth capacitor, both a second end of a tenth capacitor and a first end of the eleventh inductor are connected to the combining nodes, and a second end of the third power supply, a second end of the ninth inductor, a second end of the tenth inductor, and a second end of the eleventh inductor are all grounded, wherein the third power supply is configured to supply power to the auxiliary amplifier through the eighth inductor.

12. The radio frequency power amplifier of claim 11, wherein the impedance conversion circuit comprises a twelfth inductor, an eleventh capacitor, and a thirteenth inductor, wherein a first end of the twelfth inductor and a first end of the eleventh capacitor are connected to the combining node, a second end of the eleventh capacitor and a first end of the thirteenth inductor are connected to a load of the radio frequency power amplifier, and a second end of the twelfth inductor and a second end of the thirteenth inductor are grounded.

13. The radio frequency power amplifier of claim 12, wherein the ninth inductor and the tenth inductor are combined into a same inductor and the seventh inductor, the eleventh inductor, and the twelfth inductor are combined into a same inductor.

14. The radio frequency power amplifier of claim 1, wherein an output impedance of the main amplifier is less than or equal to 5 ohms and an output impedance of the auxiliary amplifier is less than or equal to 5 ohms.

15. An electronic device comprising the radio frequency power amplifier of claim 1.

* * * * *